(12) United States Patent
Duval et al.

(10) Patent No.: US 9,219,000 B2
(45) Date of Patent: Dec. 22, 2015

(54) METHOD FOR PROCESSING SEMICONDUCTORS USING A COMBINATION OF ELECTRON BEAM AND OPTICAL LITHOGRAPHY

(71) Applicant: RAYTHEON COMPANY, Waltham, MA (US)

(72) Inventors: Paul J. Duval, Lexington, MA (US); Kamal Tabatabaie, Sharon, MA (US); William J. Davis, Hollis, NH (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/225,885

(22) Filed: Mar. 26, 2014

(65) Prior Publication Data

US 2014/0206173 A1 Jul. 24, 2014

Related U.S. Application Data

(62) Division of application No. 13/404,245, filed on Feb. 24, 2012, now Pat. No. 8,754,421.

(51) Int. Cl.
*H01L 21/76* (2006.01)
*H01L 21/71* (2006.01)
(Continued)

(52) U.S. Cl.
CPC ............... *H01L 21/71* (2013.01); *G03F 9/708* (2013.01); *G03F 9/7076* (2013.01);
(Continued)

(58) Field of Classification Search
CPC ............ H01L 23/544; H01L 2223/544; H01L 2223/5442; H01L 21/71; H01L 21/68; H01L 21/682; G03F 9/708; G03F 9/7076
USPC .......................................................... 438/401
See application file for complete search history.

(56) References Cited

U.S. PATENT DOCUMENTS 4,968,637 A * 11/1990 Mozzi et al.
5,451,529 A    9/1995 Hsu et al.
(Continued)

FOREIGN PATENT DOCUMENTS

| GB | 2 363 677 A | 11/2000 |
|---|---|---|
| JP | 2011-023453 A | 3/2011 |
| WO | WO 2011/007472 A1 | 1/2011 |

OTHER PUBLICATIONS

Notification of Transmittal of the International Search Report and the Written Opinion of the International Searching Authority, or the Declaration, PCT/US2013/020611, Mar. 6, 2013, 1 page.

(Continued)

*Primary Examiner* — Minh-Loan Tran
*Assistant Examiner* — Farid Khan
(74) *Attorney, Agent, or Firm* — Daly, Crowley, Mofford & Durkee, LLP

(57) ABSTRACT

Forming an alignment mark on a semiconductor structure using an optical lithography to form a metal alignment mark on a substrate of the structure, using the formed metal alignment mark to form a first feature of a semiconductor device being formed on the substrate using optical lithography, and using the formed metal alignment mark to form a second, different feature for the semiconductor using electron beam lithography. In one embodiment, the first feature is an ohmic contact, the second feature is a Schottky contact, the metal alignment mark is a refractory metal or a refractory metal compound having an atomic weight greater than 60 such as TaN and the semiconductor device is a GaN semiconductor device. A semiconductor structure having a metal alignment mark on a zero layer of the structure, the metal alignment mark is a TaN and the semiconductor is GaN.

24 Claims, 10 Drawing Sheets

(51) Int. Cl.
  *G03F 9/00* (2006.01)
  *H01L 23/544* (2006.01)

(52) U.S. Cl.
  CPC ...... *H01L 23/544* (2013.01); *H01L 2223/5442* (2013.01); *H01L 2223/54426* (2013.01); *H01L 2223/54453* (2013.01); *H01L 2924/0002* (2013.01)

(56) References Cited

U.S. PATENT DOCUMENTS

| | | | |
|---|---|---|---|
| 5,686,325 A * | 11/1997 | Moriuchi et al. | 438/571 |
| 5,866,447 A | 2/1999 | Liu | |
| 6,054,361 A | 4/2000 | Tan et al. | |
| 6,197,481 B1 | 3/2001 | Chang et al. | |
| 6,576,529 B1 * | 6/2003 | Boulin et al. | 257/E23.179 |
| 6,602,641 B1 | 8/2003 | Liu | |
| 6,908,514 B2 | 6/2005 | Chang et al. | |
| 7,052,941 B2 | 5/2006 | Lee | |
| 7,170,141 B2 | 1/2007 | Kornegay et al. | |
| 7,256,865 B2 | 8/2007 | Consolini et al. | |
| 7,723,813 B2 | 5/2010 | Kanakasabapathy et al. | |
| 8,193,591 B2 | 6/2012 | Green et al. | |
| 8,247,843 B2 | 8/2012 | Gunter et al. | |
| 8,350,273 B2 | 1/2013 | Vielemeyer | |
| 8,450,774 B2 | 5/2013 | Shi et al. | |
| 2002/0004283 A1 * | 1/2002 | Boulin et al. | 438/424 |
| 2008/0038897 A1 * | 2/2008 | Suzuki et al. | 438/401 |
| 2009/0032978 A1 * | 2/2009 | Bucchignano et al. | 257/797 |
| 2009/0243123 A1 | 10/2009 | Meisner et al. | |
| 2010/0073671 A1 | 3/2010 | Chou et al. | |
| 2010/0302520 A1 * | 12/2010 | Hwang | 355/53 |
| 2010/0320559 A1 | 12/2010 | Hirose et al. | |
| 2010/0327451 A1 | 12/2010 | Chou et al. | |
| 2013/0015462 A1 | 1/2013 | Green et al. | |
| 2013/0221365 A1 | 8/2013 | Duval et al. | |

OTHER PUBLICATIONS

International Search Report, PCT/US2013/020611, Mar. 6, 2013, 4 pages.
Written Opinion of the International Searching Authority, PCT/US2013/020611, Mar. 6, 2013, 8 pages.
Notice of Allowance and Issue Fee Due, dated Feb. 26, 2014, U.S. Appl. No. 13/404,245, 7 pages.
Notification Concerning Transmittal of The International Preliminary Report on Patentability (Chapter I of the Patent Cooperation Treaty), PCT/US2013/020611, Sep. 4, 2014, 1 page.
International Preliminary Report on Patentability , PCT/US2013/020611, Aug. 26, 2014, 1 page.
PCT International Preliminary Report on Patentability, PCT/US2013/020611, Aug. 26, 2014, 1 page.
Written Opinion of the International Searching Authority, PCT/US2013/020611, Mar. 6, 2013, 7 pages.

* cited by examiner

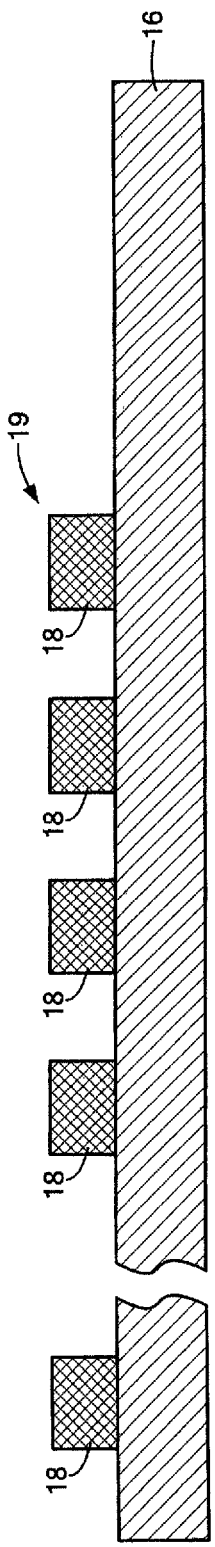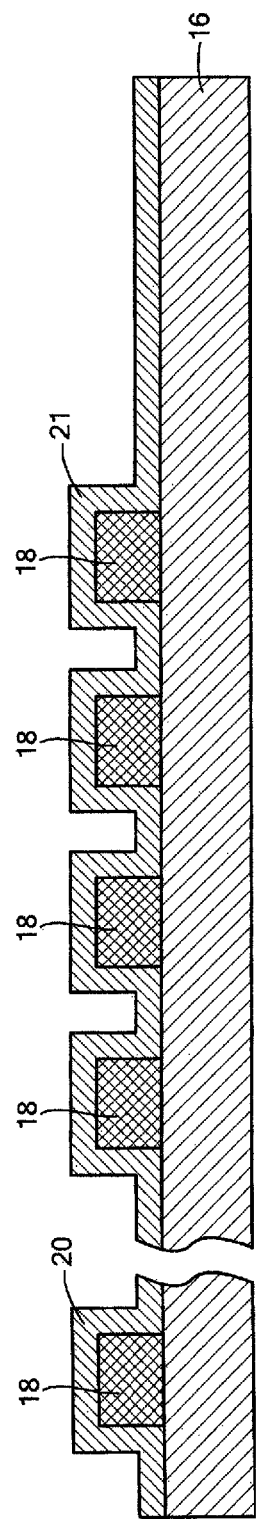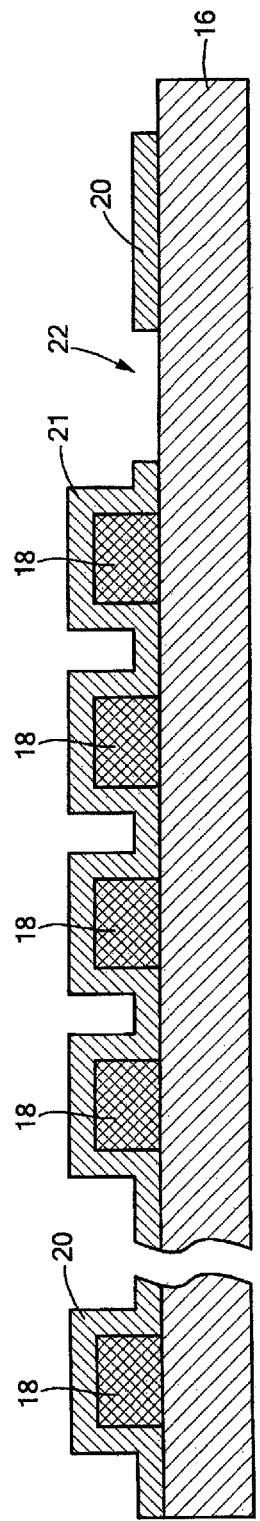

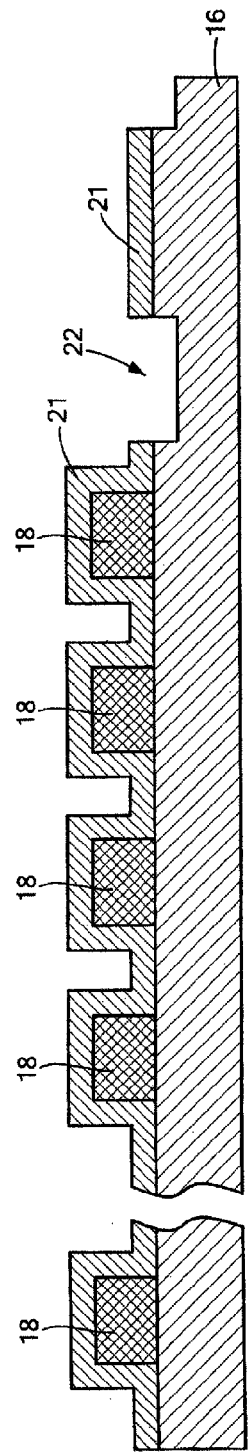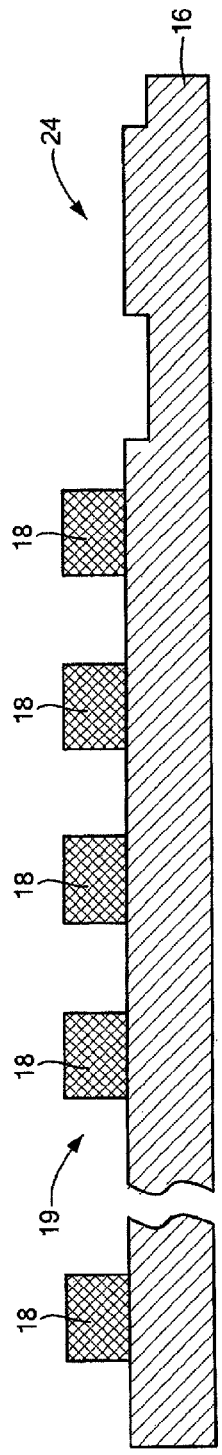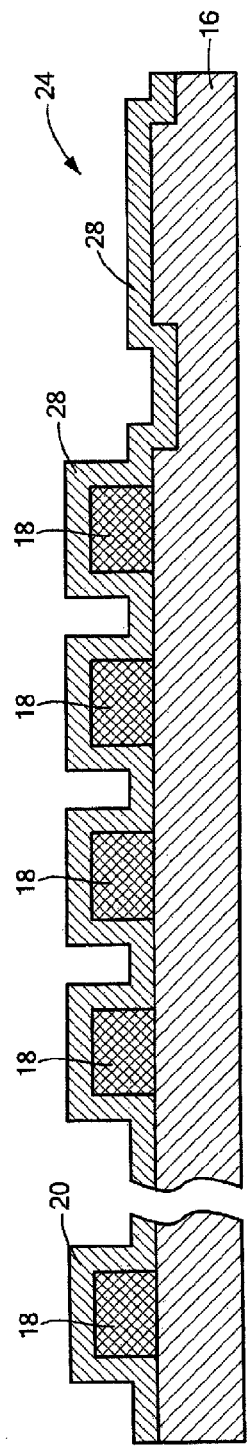

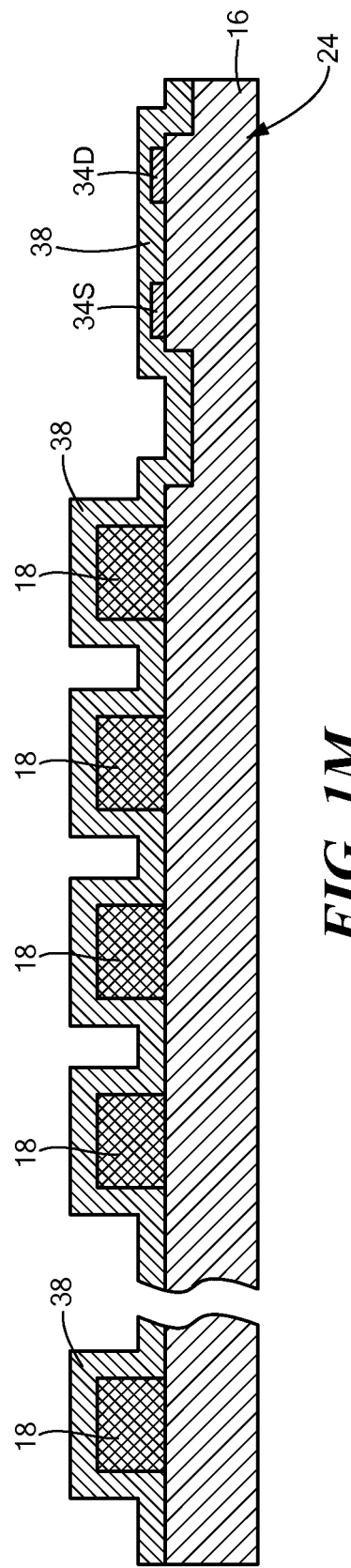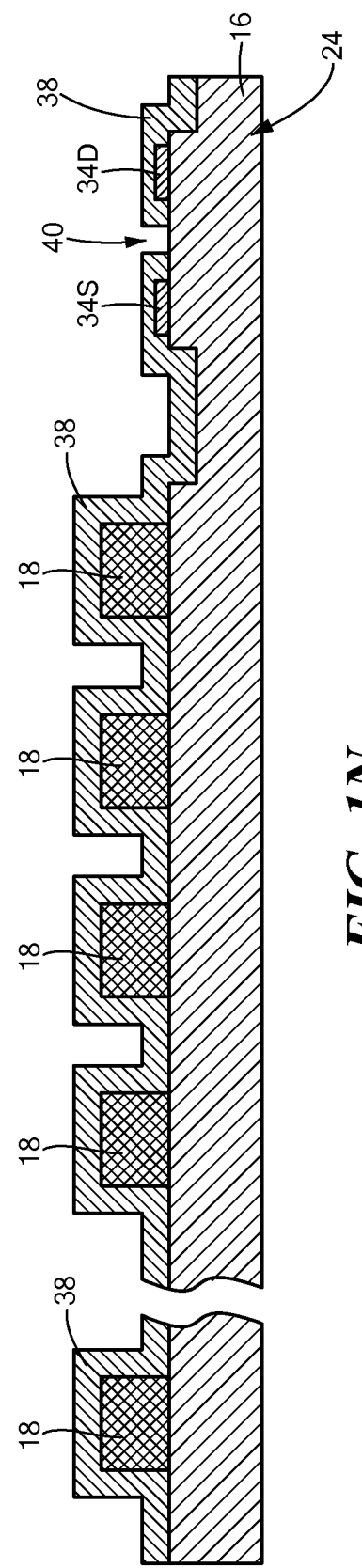

Alignment Signal OHMIC Metal

Alignment Signal OHMIC Metal

Variations of E-Beam Alignment Signal for
Ohmic Metal Across Wafer

E-Beam Alignment Signal for Tantalum Nitride

METHOD FOR PROCESSING SEMICONDUCTORS USING A COMBINATION OF ELECTRON BEAM AND OPTICAL LITHOGRAPHY

CROSS REFERENCE TO RELATED APPLICATION

This is a divisional application of application Ser. No. 13/404,245 filed Feb. 24, 2012 which application is hereby incorporated herein by reference in its entirety.

TECHNICAL FIELD

This disclosure relates generally to methods for processing semiconductors and more particularly to methods for processing semiconductors using a combination of electron beam and optical lithography.

BACKGROUND AND SUMMARY

As is known in the art, fabrication of semiconductor devices utilizing a combination of electron beam (i.e., e-beam) and optical lithography systems requires alignment features that are optimized for both systems and are placed on the substrate with minimum placement errors between the two sets of features. More particularly, optical lithography uses alignment marks etched into a semiconductor substrate while electron beam lithography requires metal alignment marks. Further, there is less backscatter of electrons from the semiconductor than from metal. Further, while electron beam lithography is slower than optical lithography, electron beam lithography is able to produce smaller features than optical lithography. Another requirement for these features is that they be capable of standing up to subsequent wafer processes. The best method for insuring minimum placement errors is to pattern both sets of alignment features in one operation.

Typically the alignment process includes using an optical alignment tool to etch an alignment mark into the surface of the substrate or a zero layer (where Zero layer is the layer patterned on the substrate to serve as the pattern to which every subsequent layer is aligned) during the first patterning step. More particularly, in the formation of FETs in monolithic microwave integrated circuit (MMIC) mesas in a semiconductor substrate, one technique used for forming lithographic mask alignment marks is to use a zero layer process where the alignment mark would be formed in the surface of the substrate (i.e., the zero layer) prior to firming the MMIC mesa and another technique would be to combine the zero layer alignment marks with mesa layer to form the alignment marks simultaneously with the formation of the MMIC mesas while still another technique is the use of a zero layer to etch alignment marks into the substrate prior to the ohmic metal layer in a mesa-less process.

During subsequent processing, as for example forming gates in FETs, electron beam tools capable of creating smaller linewidth features, such as Schottky gate contacts, than optical tools are required. These electron beam tools use electromagnetic alignment techniques and hence require metal alignment marks.

More particularly, after the optical lithography processing metal alignment features are created on the previously processed wafer to provide adequate contrast of secondary or backscattered electrons for the electron beam alignment tool.

Thus, prior methods of mixing and matching optical and e-beam lithography systems developed for compound semiconductors have been based on alignment marks for the electron lithography system which are generated with the ohmic metal layer. This layer is itself aligned to an earlier layer having registration errors with respect to the initial optical alignment features imparted by the optical lithography step. Typically gold is a preferred metal layer for the electron beam alignment features because it's high atomic weight.

The inventors have recognized that for some semiconductor devices, early use of metal layers can pose a contamination risk during subsequent high temperature operations. This is particularly true in fabricating GaN FETS. More particularly, while with GaAs device fabrication the ohmic metal provides an adequate alignment signal due to differences in the metals composition and alloy conditions; the inventors have recognized that the alloy conditions and composition of the ohmic metal for GaN is different than the ohmic metal on GaAs and that with GaN the alloyed ohmic metal edges are very rough thereby making its use as an alignment mark for subsequent electron beam alignment undesirable nature of the post alloyed ohmic metal.

A typical process used to form FETs in a semiconductor MMIC would be to form a mesa by patterning a photoresist layer using optical lithography followed by an etching of the mesa pattern and alignment mark patterns in the surface of the substrate. The first mesa etch then also defines alignment marks for optical stepper. Later masks used to form ohmic contacts and additional alignment marks are aligned to the etched mesas. Then, metal is deposited for alloying and forming the ohmic source and drain contacts for the FET. The ohmic contact metal is also used to provide alignment marks for subsequent electron beam lithography to be used in forming the gate contacts; however, they may not be adequate in providing accurate alignment to the mesas alignment mark. In other words, the gate alignment error would equal the sum of any electron beam alignment error to the ohmic contact alignment mark plus any errors in the ohmic contact alignment mark to the mesa alignment mark.

More particularly, ohmic metal has been used for optical alignment as well as electron beam alignment, but the issue remains that you now have multiple layers which are aligned to different features. In addition to that the ohmic metal patterning process must be optimized to define the ohmic contact. The alignment marks defined in an ohmic contact are often not the optimum thickness or surface roughness for alignment purposes. As noted above, the inventors have recognized that with a GaN process the ohmic alignment marks are so rough that they are not useful for e-beam alignment, and another metal layer has had to he added to define the e-beam alignment marks.

The inventors have discovered a level zero metal layer that can withstand high temperature processing, such as used in GaN ohmic metal formation at 850-950 C for 10-30 seconds, without changing its geometrical shape or physical properties of the metal This level zero metal layer also severs well as alignment mark for both optical lithography and E-beam lithography.

In accordance with one embodiment of the disclosure, a method is provided for providing an alignment mark on a semiconductor structure, comprising: using an optical lithography to form a metal alignment mark on a substrate of the structure; using the formed metal alignment mark to form a first feature of a semiconductor device being formed on the substrate, such formation comprising using optical lithography; and using the formed metal alignment mark to form a second, different feature for the semiconductor device being formed on the substrate, such formation comprising using electron beam lithography.

In one embodiment, the first feature is a metal feature having a material different from the alignment mark metal.

In one embodiment, the first feature is an ohmic contact.

In one embodiment, the second feature is a Schottky contact.

In one embodiment, the metal alignment mark is a refractory metal or a refractory metal compound.

In one embodiment, the refractory metal or refractory metal compound has an atomic weight greater than 60.

In one embodiment, the metal alignment mark is TaN.

In one embodiment, the semiconductor device is a GaN semiconductor device.

In one embodiment, a semiconductor structure is provided having a metal alignment mark on a zero layer of the structure.

In one embodiment, a semiconductor structure is provided having a semiconductor device formed therein, such device having an ohmic contact and a Schottky contact formed in upper layers of the structure, such structure having a metal alignment mark on a lower layer of the structure.

With such method, simultaneous patterning of optical alignment features and secondary or backscattered electron alignment features is achieved using a refractory metal nitride having both sufficient atomic weight and thickness to provide a strong backscattered or secondary alignment signal, and sufficient thickness to create a good optical alignment signal. Edge quality and is improved over gold features having larger grain size, and the refractory metal nitride is unaffected by subsequent high temperature operations.

The use a refractory metal or a refractory metal compound of sufficient atomic weight allows optimization of a dedicated alignment layer for optical alignment signal quality while simultaneously optimizing the layer for backscattered and secondary electron alignment signal quality. Specifically the use of a tantalum nitride (TaN) film was shown to exhibit superior alignment signal quality in both optical and e-beam alignment systems and remain stable when subjected to a high temperature ohmic alloy process step.

In accordance with one embodiment, optical lithography is used to form a metal, for example a refractory metal or refractory compound metal, such as for example, TaN, alignment mark on the zero layer (or when the MMIC mesa is formed) and then such alignment mark for optical lithography processing up to the source and drain ohmic contacts of, for example, a FET, such as a GaN FET, and then electron beam lithography is used to form the Schottky contact gate using the metal alignment mark.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1A:
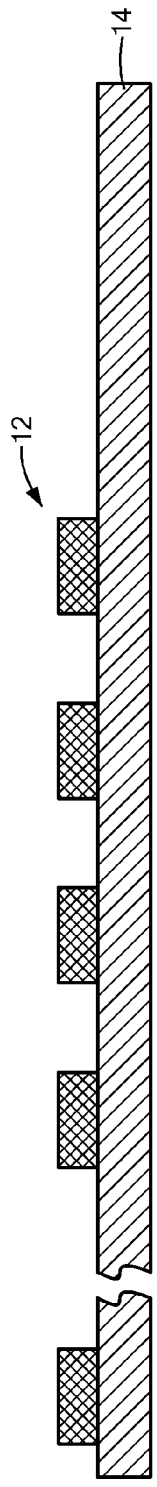
FIGS. 1A through 1P, are diagrams showing a process for forming a semiconductor device, here a Field Effect Transistor (PET), according to the disclosure.
Figure 1B:
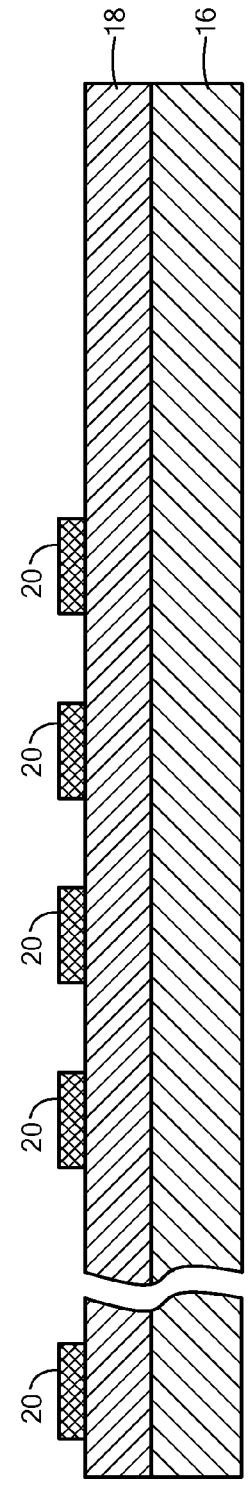
Figure 1C:
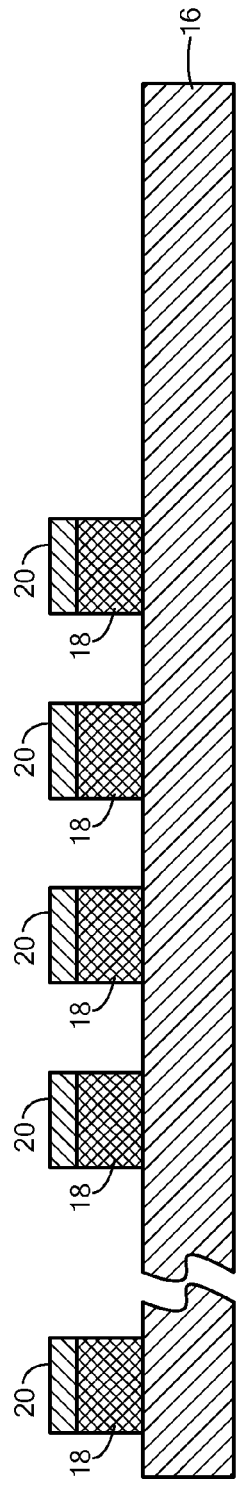
Figure 1J:
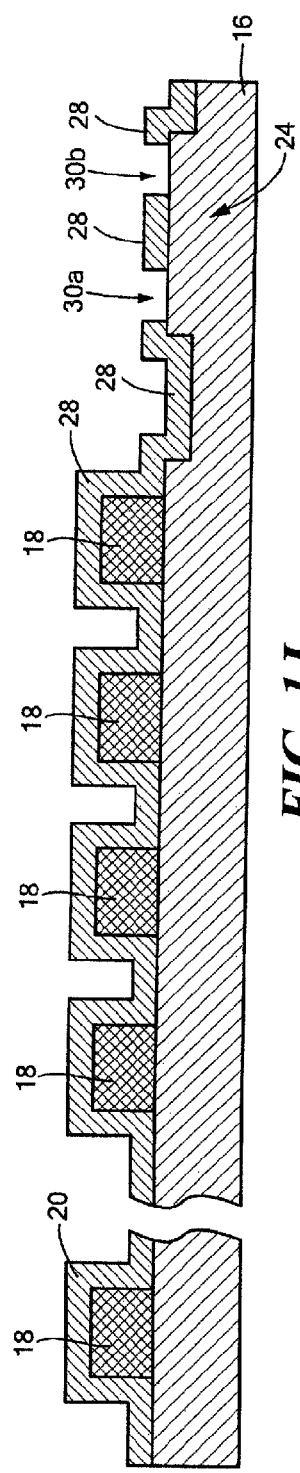
Figure 1K:
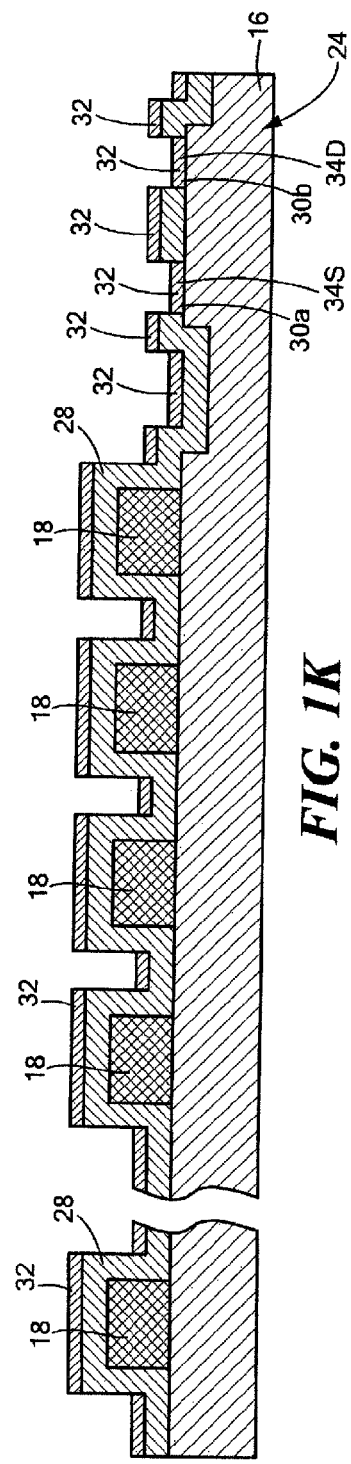
Figure 1L:
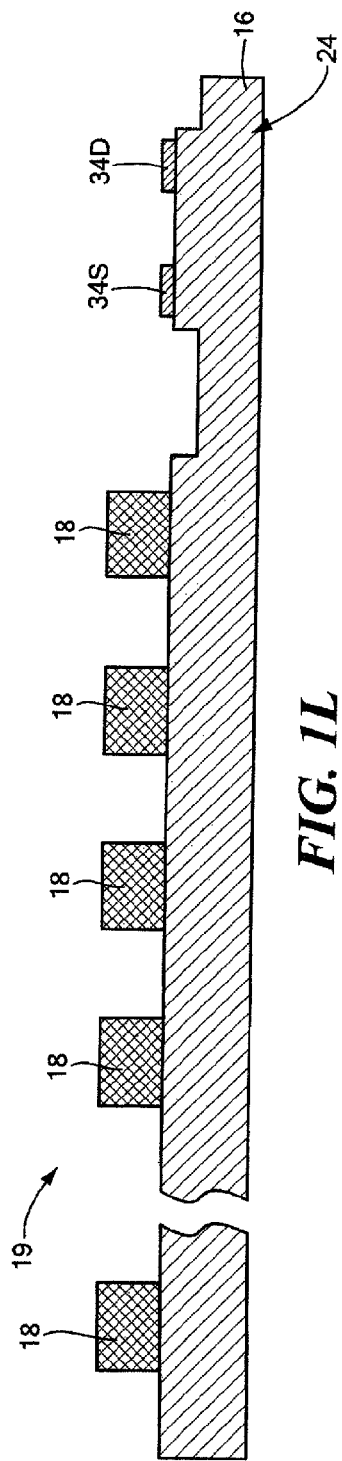
Figure 1O:
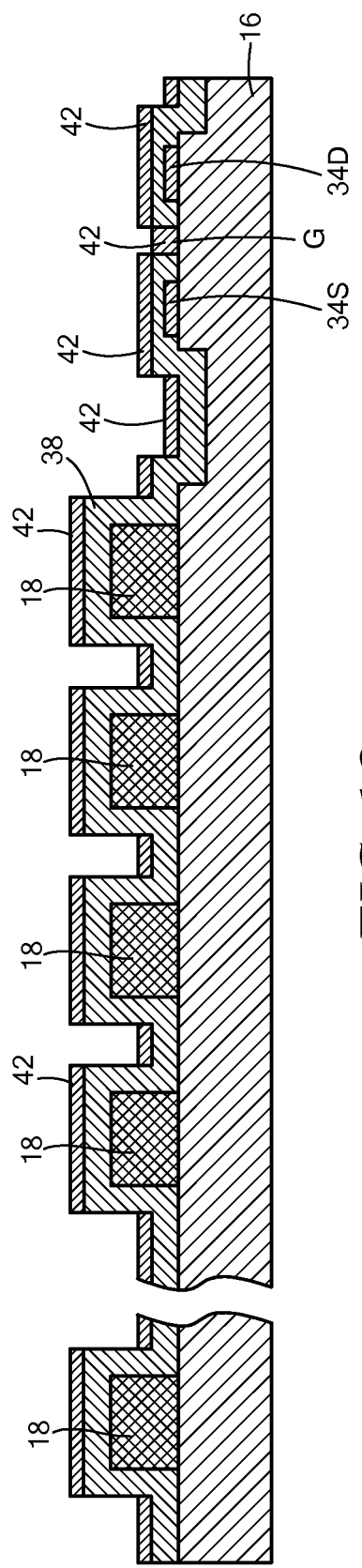
Figure 1P:
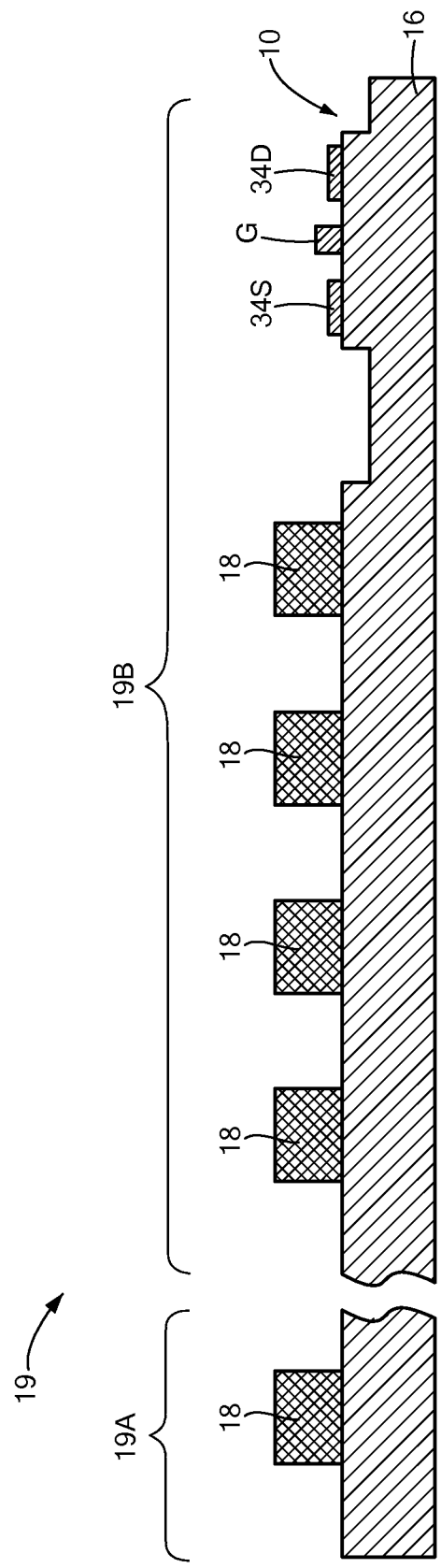

Referring now to FIGS. 1A through 1P, a process for forming a semiconductor device, here a Field Effect Transistor (FET) 10 (FIG. 1F) is shown. First, an alignment mark pattern 12 is formed on an optical lithographic reticle 14 (FIG. 1A). The pattern 12 has two portions; an electron beam alignment pattern portion 12a and an optical alignment pattern portion 12b. A semiconductor substrate 16, here GaN, having a layer 18 of metal deposited on the upper surface of the substrate 16 (i.e., the zero layer of the process) is coated with a layer of photoresist material 20 (FIG. 1B). The metal material in layer 18 is a refractory metal or a refractory metal compound, here for example TaN having a thickness of 500 Angstroms. Other materials may be used for metal layer 18, for example, Hafnium, Tantalum, Tungsten, Rhenium, or compounds thereof such as when combined with nitrogen, or metals having an atomic weight greater than 60.

Next, the alignment mark pattern 12 on the reticle 14 is transferred to a corresponding pattern in the photoresist material 20 using conventional optical lithography (FIG. 1). Next, exposed regions of the metal layer 18 are etched away as shown in FIG. 1C to form a metal alignment mark 19. It is noted that the metal alignment mark 19 has two portions: an electron beam metal alignment portion 19a and an optical metal alignment portion 19b. Next, the patterned photoresist material 20 is removed as shown in FIG. 1D leaving the electron beam metal alignment portion. 19a and an optical metal alignment portion 19b on the surface of the substrate 10. As will he described, the metal alignment mark 19 will be used as a mask alignment mark for both subsequent optical and electron beam lithography. It is noted that the electron beam metal alignment portion 19a is used for the electron beam lithography and the optical metal alignment portion 19b is used for the optical lithography.

Next, the surface of the structure shown in FIG. 1D is coated with a photoresist layer 21 (FIG. 1E). Next, optical lithography equipment, not shown, uses the metal alignment mark portion 19b of the metal alignment mark 19 to pattern a mesa mask (not shown) into the photoresist layer 21 to thereby expose a portion 22 of the surface of the substrate 16 where a semiconductor mesa 24 is to be formed, as shown in FIG. 1F. Next, the exposed portion 22 is etched as shown in FIG. 1G. Next, the photoresist layer 21 is lifted off removing portions of the metal layer 20 thereon and leaving the metal alignment mark 19, as shown in FIG. 1H.

Next, the surface of the structure shown in FIG. 1H is coated with a photoresist layer 28 (FIG. 1I). Next, optical lithography equipment, not shown, uses the metal alignment mark portion 19b of the metal alignment mark 19 (FIG. 1H) to pattern an ohmic contact mask (not shown) into the photoresist layer 28 to thereby expose portion 30a, 30b of the surface of the mesa 24 of substrate 16 where source and drain metal ohmic contacts are to be formed, as shown in FIG. 1J. Next, a metal layer 32 is deposed over the patterned photoresist layer 28 and onto the exposed portions 30a, 30b of the surface of the mesa 24 of substrate 16 where source and drain metal ohmic contacts are to be formed, as shown in FIG. 1K. Here, with GaN, the metal layer 32 includes gold. The structure is then processed to alloy the metal 32 in regions 30a, 30b to form source and drain metal Ohmic contacts 34S, 34D, as shown in FIG. 1K, Here, the GaN ohmic metal formation is at 850-950 C for 10-30 seconds. Next, the patterned photoresist layer 28 is lifted off along with the portions of the photoresist layer 28 thereon and leaving the mask alignment mark 19, as shown in FIG. 1L.

Next, the surface of the structure shown in FIG. 1L is coated with a photoresist layer 38 (FIG. 1M). Next, election beam lithography equipment, not shown, uses the metal alignment mark portion 19a of the metal alignment mark 19 (FIG. 1L) to pattern a gate Schottky contact mask (not shown) into the photoresist layer 38 to thereby expose the portion 40 of the surface of the mesa 24 of substrate 16 where gate Schottky contact is to be formed, as shown in FIG. 1N. Next, a metal layer 42 is deposed over the patterned photoresist layer 38 and onto the exposed portion 40 of the surface of the mesa 24 of substrate gate Schottky contact G is to be formed, as shown in FIG. 1O. Here the metal layer 42, with GaN, the metal includes gold. The structure is then processed to alloy the metal 42 in regions 40 to form gate Schottky contact G, as shown in FIG. 1P. Next, the patterned photoresist layer 38 is lifted off removing the portions of the metal layer 42 thereon leaving the alignment mask 19 for any further alignment required processing (as for example forming other active, passive and transmission line MMIC circuitry, not shown), as shown in FIG. 1L.

Figure 2:
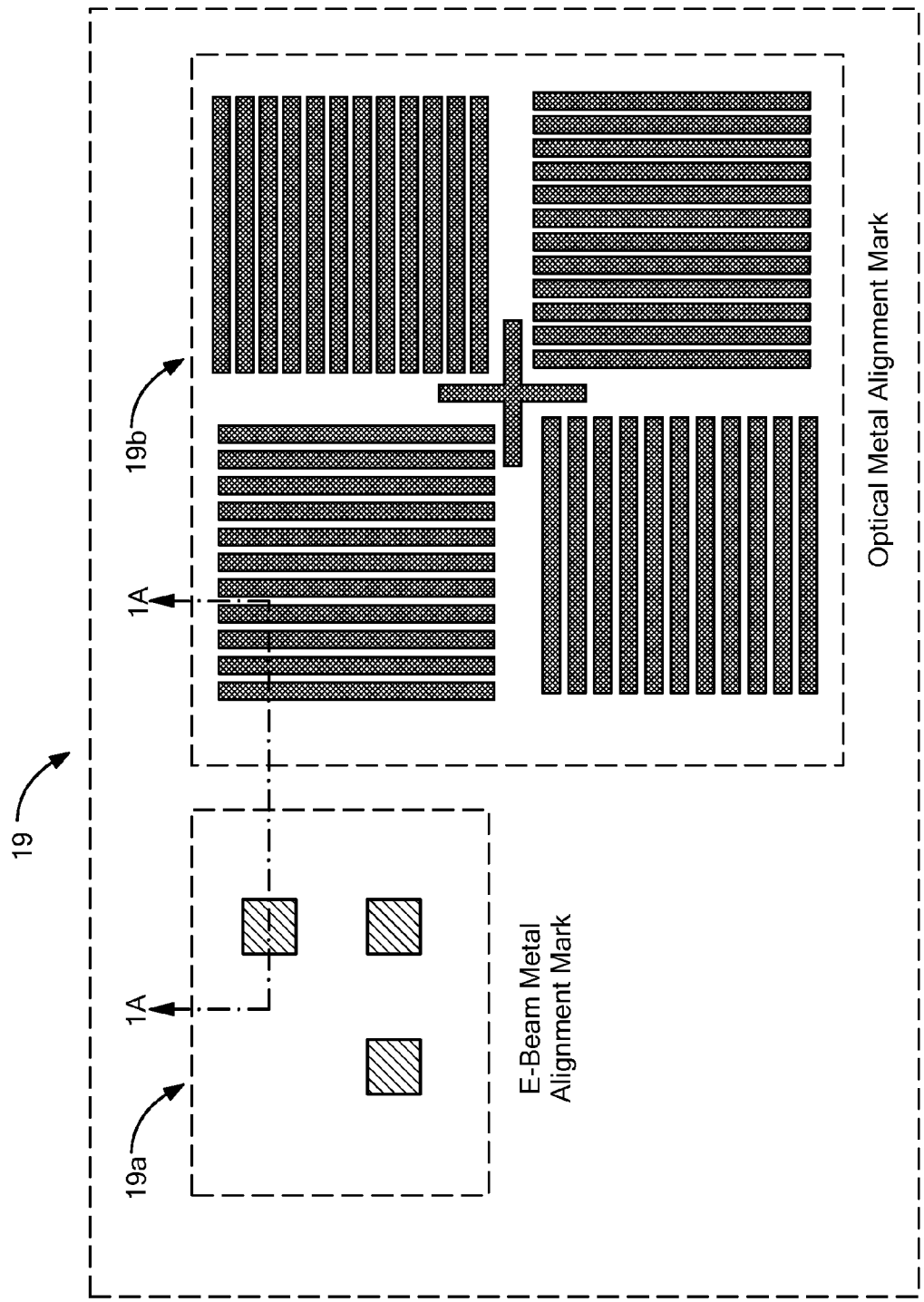
FIG. 2 shows a metal alignment mark on a semiconductor wafer having in one region thereof an optical metal alignment mark portion and in another region thereof an electron beam metal alignment portion.
Figure 3A:
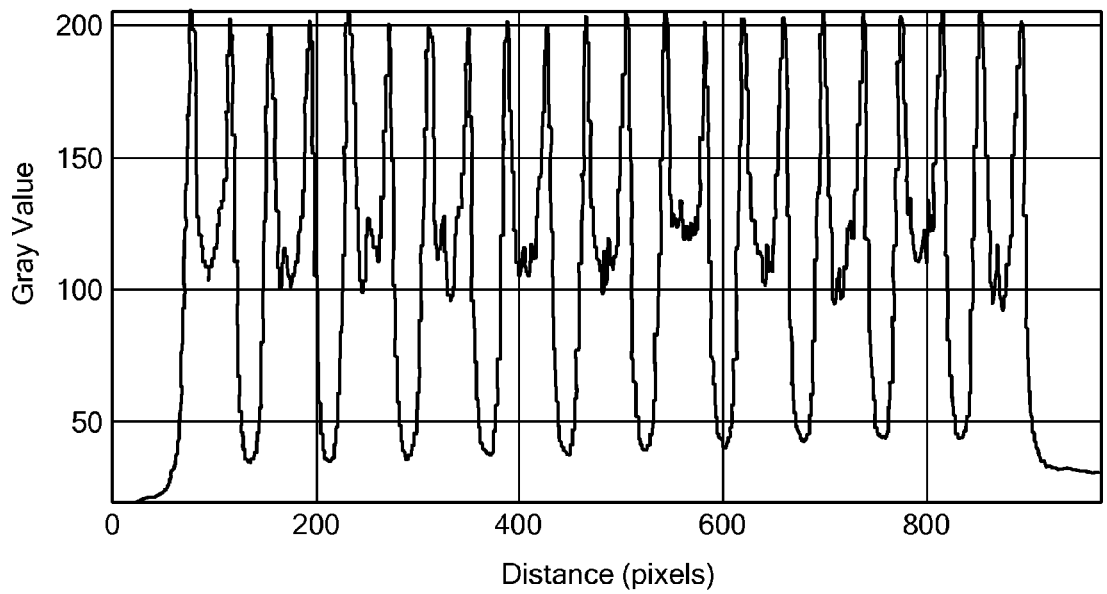
FIG. 3A shows the alignment signal (amplitude vs. distance) for the indicated portion of the optical alignment mark of FIG. 2 when the mark is comprised of ohmic metal.
Figure 3B:
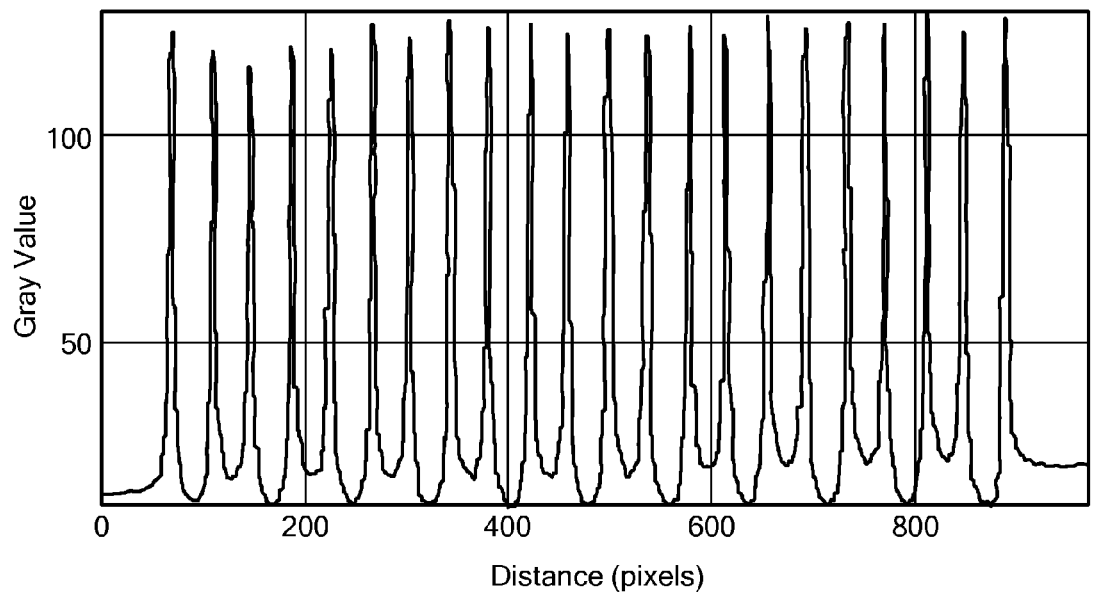
FIG. 3B shows the alignment signal (amplitude vs distance) for the indicated portion of the optical alignment mark of FIG. 2 when the mark is comprised of tantalum nitride.
Figure 3C:
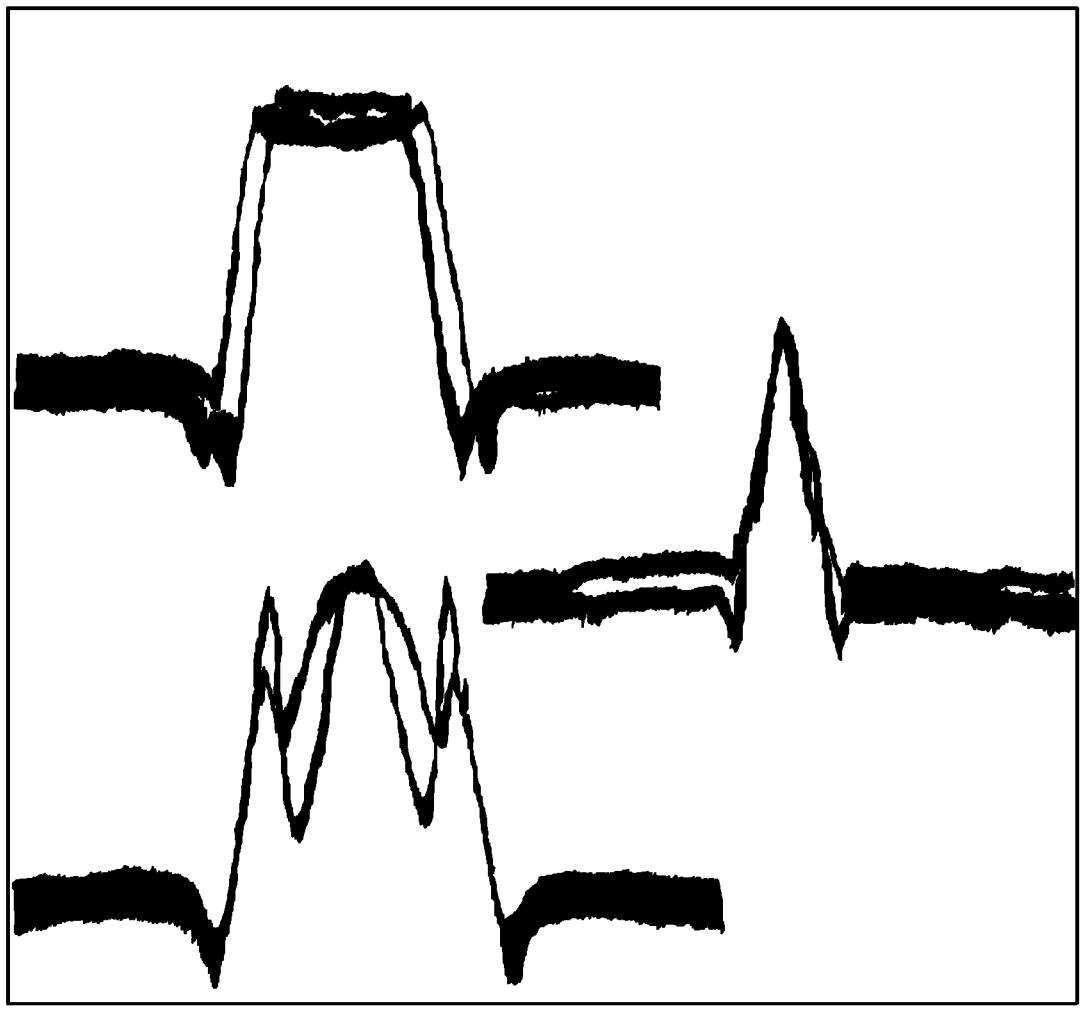
FIG. 3C shows three variations of the backscattered electron alignment signals (amplitude vs. distance) according to the PRIOR ART taken at three locations on the wafer of when the electron beam alignment mark is comprised of ohmic metal; each backscattered electron alignment signal being a composite signal of the X position and Y position scans over the electron beam alignment mark with variation in the shape and the placement of the to X and Y scans in each location and from location to location across the wafer being observed.
Figure 3D:
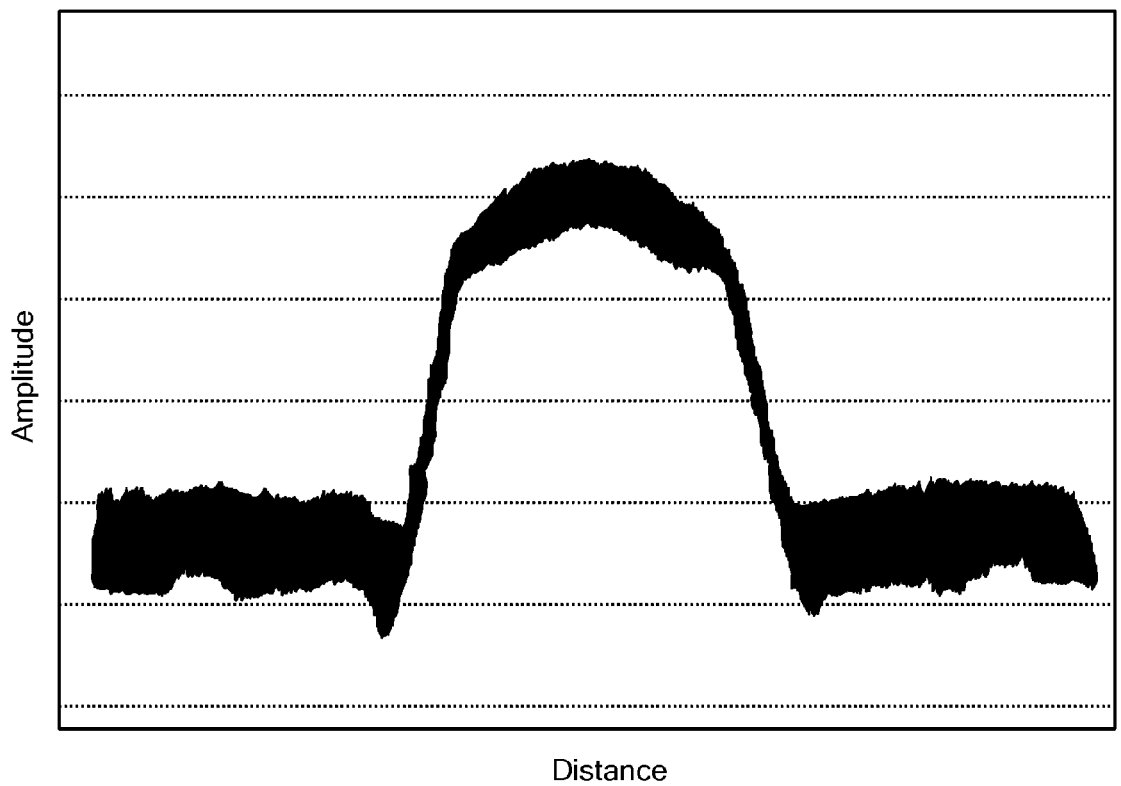
FIG. 3D shows one example of a backscattered electron alignment signal according to the disclosure when the electron beam alignment mark is comprised of tantalum nitride; the X and Y scans for these marks overlay closely and can not be discerned from one another, only one example being required since all the marks on the wafer produce a backscattered electron alignment signal which is substantially the same for all scans.

FIG. 2 shows an optical metal alignment mark portion 19b of the electron beam metal alignment mark portion 19a. FIG. 3A shows the gray value as a function of distance across the optical alignment mark of FIG. 2 when the mark is comprised of ohmic metal. FIG. 3B is gray value as a function of distance across the optical alignment mark of FIG. 2 when the mark is comprised of tantalum nitride. It is noted that the gray value pattern with the zero layer tantalum nitride optical alignment mark is more well defined than the gray value pattern with the ohmic metal optical alignment mark. FIG. 3C shows variations of electron beam alignment signals across a wafer when the electron beam alignment mark of FIG. 2 is comprised of ohmic metal. FIG. 3D shows the electron beam alignment signal for the electron beam alignment mark is comprised of tantalum nitride. It is noted that the alignment signal with the zero layer tantalum nitride electron beam alignment mark is consistent across the wafer, and in the X and Y directions unlike the highly variable ohmic metal electron beam alignment mark.

A number of embodiments of the disclosure have been described, Nevertheless, it will be understood that various modifications may be made without departing from the spirit and scope of the disclosure. For example, the optical beam mark and the electron beam mark may have the same pattern. Thus, the metal alignment mark 19 may have a single portion rather than an electron beam metal alignment portion 19a and an optical metal alignment portion 19b. Accordingly, other embodiments are within the scope of the following claims.

What is claimed is:

1. A method, comprising:
    forming a metal alignment mark on a structure, such metal alignment mark have a first portion and a second portion, the first portion having a first predetermined pattern and the second portion having a second predetermined pattern, the first predetermined pattern being different from the second predetermined pattern;
    using a first portion of the formed metal alignment mark to form a first feature of a semiconductor device being formed on the structure such first feature formation comprising using optical lithography; and
    using a second portion of the formed metal alignment mark to form a second, different feature for the semiconductor device being formed on the structure, such second, different feature formation comprising using electron beam lithography.

2. The method recited in claim 1 wherein the first feature is a metal feature having a material different from the alignment mark metal.

3. The method recited in claim 1 wherein the first feature is an ohmic contact.

4. The method recited in claim 3 wherein the second feature is a Schottky contact.

5. The method recited in claim 1 wherein the metal alignment mark is a refractory metal or a refractory metal compound.

6. The method recited in claim 5 wherein the refractory metal or refractory metal compound has an atomic weight greater than 60.

7. The method recited in claim 1 wherein the metal alignment mark is TaN.

8. The method recited in claim 1 wherein the semiconductor device is a GaN semiconductor device.

9. The method recited in claim 8 where the first feature is an ohmic contact.

10. The method recited in claim 9 wherein the second feature is a Schottky contact.

11. The method recited in claim 8 wherein the metal alignment mark is a refractory metal or a refractory metal compound.

12. The method recited in claim 11 wherein the refractory metal or refractory metal compound has an atomic weight greater than 60.

13. The method recited in claim 8 wherein the metal alignment mark is TaN.

14. The method recited in claim 1 wherein the first feature is an ohmic contact.

15. The method recited in claim 14 wherein the second feature is a Schottky contact.

16. A method, comprising:
    simultaneously forming, on a common surface of a structure, an electron beam alignment mark having a first predetermined pattern and an optical alignment mark having a second predetermined pattern, the first predetermined pattern being different from the second predetermined pattern, the electron beam alignment mark and the optical alignment mark being formed on different portions of the common surface of the structure;
    using the optical beam alignment pattern mark to form a first feature of a semiconductor device being formed on the structure, such formation comprising using optical lithography; and using the electron beam alignment mark to form a second, different feature for the semiconductor device being on the structure, such second, different feature formation comprising using electron beam lithography.

17. The method recited in claim 16 wherein the optical alignment pattern mark is used only for the optical lithography and the electron beam alignment mark is used only for the electron beam lithography.

18. The method recited in claim 1 wherein the metal alignment mark is a Zero layer is the layer patterned on the substrate to serve as the pattern to which every subsequent layer is aligned.

19. A method comprising:

forming a metal alignment mark on a structure, such metal alignment mark have a first portion and a second portion, the first portion having a first predetermined pattern and the second portion having a second predetermined pattern, the first predetermined pattern being different from the second predetermined pattern;

using the first portion of the metal alignment mark with optical lithography to form a first feature on the structure; and using the second portion of the metal alignment mark with electron beam lithography to form a second feature on the structure.

20. The method recited in claim 19 wherein the metal alignment mark is a Zero layer is the layer patterned on the structure to serve as the pattern to which every subsequent layer is aligned.

21. The method recited in claim 20 wherein the metal alignment mark is a refractory metal or a refractory metal compound.

22. The method recited in claim 21 wherein the refractory metal or refractory metal compound has an atomic weight greater than 60.

23. The method recited in claim 21 wherein the metal alignment mark is TaN.

24. The method recited in claim 21 wherein the semiconductor device is a GaN semiconductor device.

\* \* \* \* \*